(12) United States Patent
Nishida

(10) Patent No.: US 7,701,072 B2
(45) Date of Patent: Apr. 20, 2010

(54) SEMICONDUCTOR DEVICE AND MANUFACTURING METHOD THEREFOR

(75) Inventor: Takayuki Nishida, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 19 days.

(21) Appl. No.: 11/450,388

(22) Filed: Jun. 12, 2006

(65) Prior Publication Data

US 2006/0279001 A1    Dec. 14, 2006

(30) Foreign Application Priority Data

Jun. 13, 2005    (JP) .............................. 2005-172294

(51) Int. Cl.
*H01L 23/52*    (2006.01)

(52) U.S. Cl. .......................... 257/784; 257/14; 257/18; 257/15; 257/16; 257/17; 257/E21.521; 257/E21.531; 257/E21.522; 257/E21.524; 257/E21.528; 257/E21.53; 257/48

(58) Field of Classification Search .................. 257/48, 257/784, E21.531, E21.523, 15, 16, 17, 18, 257/E21.525, E21.528, E21.529
See application file for complete search history.

(56) References Cited

U.S. PATENT DOCUMENTS

| 7,091,613 | B1 * | 8/2006 | Long et al. | .................. 257/758 |
| 2005/0173801 | A1 * | 8/2005 | Mimura et al. | .............. 257/758 |
| 2005/0248011 | A1 * | 11/2005 | Jung et al. | .................. 257/678 |

FOREIGN PATENT DOCUMENTS

JP    2002-329742 A    11/2002

* cited by examiner

*Primary Examiner*—Wael Fahmy
*Assistant Examiner*—Marc Armand
(74) *Attorney, Agent, or Firm*—Sughrue Mion, PLLC

(57) ABSTRACT

The semiconductor device according to an aspect of the invention includes: an internal circuit area having an internal circuit; an I/O circuit area positioned outside the internal circuit area; and an electrode pad placed across an outer edge of the I/O circuit area. In the electrode pad, an area outside the outer edge of the I/O circuit area is a bonding area, and an area inside the outer edge is a probe area.

9 Claims, 3 Drawing Sheets

SEMICONDUCTOR DEVICE AND MANUFACTURING METHOD THEREFOR

BACKGROUND OF THE INVENTION

1. Field of the Invention

The present invention relates to a semiconductor device and a manufacturing method therefor. In particular, the invention relates to a semiconductor device including an electrode pad and a manufacturing method therefor.

2. Description of Related Art

A semiconductor device generally includes an internal circuit and an I/O circuit where an input/output buffer circuit is built. An electrode pad for connecting an external electrode is formed on the I/O circuit. Further, a test probe as an electrical characteristic tester is brought into contact with the electrode pad formed on the I/O circuit to pass a current through the semiconductor device through the test probe for electrical characteristic testing, which is the so-called probing. That is, there are two applications of the electrode pad; the two applications are for wire bonding and for contact with the test probe. If the same electrode pad is subjected to bonding and probe testing, there is a fear that bonding strength is lowered upon the wire bonding owing to a physical damage on the electrode pad due to the test.

Japanese Unexamined Patent Application Publication No. 2002-329742 discloses a semiconductor device that is devised for overcoming this drawback. In the semiconductor device, a testing pad that contacts a test probe and a bonding pad for wire bonding are formed on the electrode pad.

However, in the semiconductor device, an inner portion of a chip may be physically damaged upon the wire bonding of the electrode pad on the chip. In other words, a circuit under the electrode pad may be physically damaged at the time of wire bonding. To that end, a wire bonding apparatus needs to execute bonding under such conditions that the chip inner portion is not physically damaged due to a load of the wire bonding. Thus, the wire bonding apparatus and its use conditions etc. should be carefully examined in consideration of the sectional structure in the chip. That is, since a load applied to the chip varies depending on a chip's sectional shape or the like, the use conditions of the bonding apparatus need to be separately set for chips of different structures. In addition, in the case of using different bonding apparatuses, the conditions have to be set for each apparatus. Especially in the case of shipping products in a chip (pellet) form without bonding, a purchaser (user) uses a desired bonding apparatus. Thus, it is necessary to carefully and individually set the optimal conditions for various bonding apparatuses.

As described above, the conventional semiconductor device has a possibility that an inner circuit of a chip is damaged depending on wire bonding conditions, so the bonding apparatus and its use conditions should be carefully examined.

SUMMARY OF THE INVENTION

A semiconductor device according to an aspect of the invention includes: an internal circuit area having an internal circuit; an I/O circuit area positioned outside the internal circuit area; and an electrode pad placed across an outer edge of the I/O circuit area. Thus, the pad can be bonded in a position outside the I/O circuit area, so the semiconductor device can be prevented from being damaged. Hence, yield can be improved and productivity can be improved as well.

According to another aspect of the invention, a manufacturing method for a semiconductor device including an internal circuit area having an internal circuit, and an I/O circuit area positioned outside the internal circuit area, includes: placing an electrode pad across an outer edge of the I/O circuit area; bringing a probe into contact with the electrode pad inside the outer edge of the I/O circuit area to execute testing; and wire-bonding the electrode pad outside the outer edge of the I/O circuit area. Thus, the pad can be bonded in a position outside the I/O circuit area, so the semiconductor device can be prevented from being damaged. Hence, yield can be improved and productivity can be improved as well.

According to the present invention, it is possible to provide a semiconductor device and a manufacturing method therefor, which can suppress a damage resulting from bonding in a simple manner.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Figure 1:
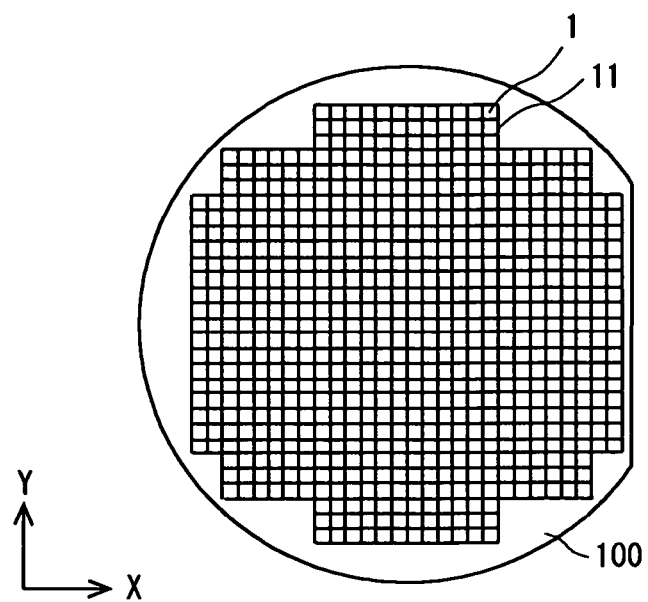
FIG. 1 is a top view schematically showing the structure of a semiconductor wafer including a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, an embodiment of the present invention is described. The following description is given for demonstrating the embodiment of the invention, so the present invention is not construed as being limited to the following embodiment. For precise explanation, the following description is partially omitted and simplified as appropriate. In addition, those skilled in the art would readily make change, addition, and replacement of components of the following embodiment within the scope of the invention. Incidentally, the same components are denoted by identical reference numerals throughout the accompanying drawings, and description thereof is omitted if not necessary.

Figure 2:
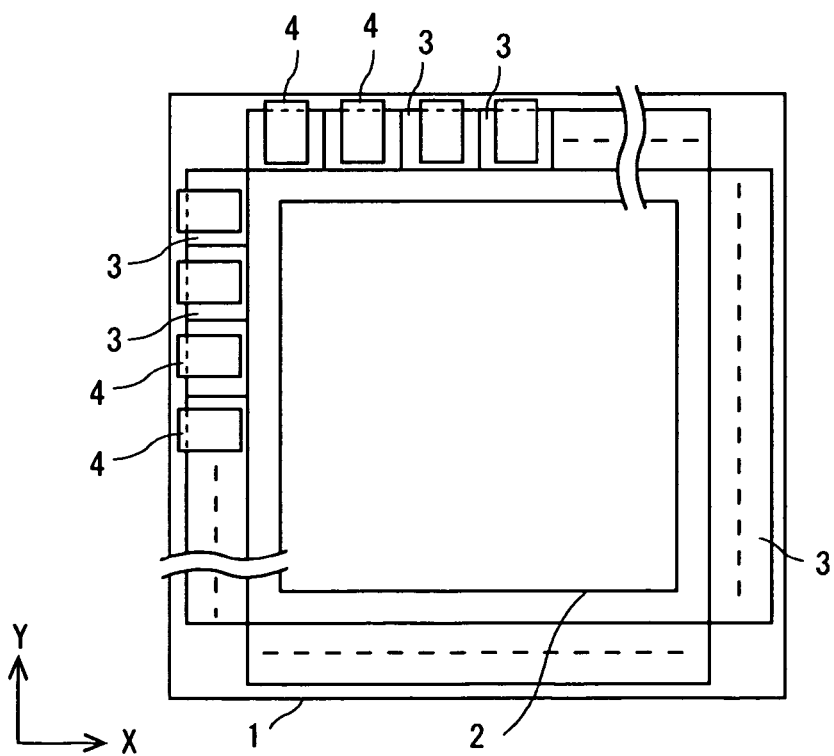
FIG. 2 is a top view schematically showing the structure of a semiconductor chip mounted on the semiconductor wafer of FIG. 1.

Referring to FIGS. 1 and 2, a semiconductor device according to the present invention is described. FIG. 1 is a top view schematically showing the structure of a semiconductor wafer including a semiconductor device of the present invention. FIG. 2 is a top view schematically showing the structure of a semiconductor chip mounted on the semiconductor wafer of FIG. 1.

As shown in FIG. 1, a plurality of rectangular semiconductor chips 1 is formed on a semiconductor wafer 100. Then, scribe lines 11 extend between the semiconductor chips 1 for separating the semiconductor chips 1 from one another. The scribe lines 11 are arranged in the X or Y direction. Assuming that the semiconductor wafer 100 is cut along the scribe lines 11, the wafer is divided into the semiconductor chips 1. The semiconductor chip 1 is structured as shown in FIG. 2. FIG. 2 is a top view showing the structure of the semiconductor chip 1.

As shown in FIG. 2, an internal circuit area 2 having an internal circuit including a memory circuit or a logic circuit is positioned at the center of the semiconductor chip 1. Plural I/O circuit areas 3 are formed to surround the internal circuit area 2 like a frame. The plural I/O circuit areas 3 are arranged along the outer edge of the semiconductor chip 1. That is, the I/O circuit areas 3 are arranged along the four sides of the rectangular semiconductor chip 1. In the I/O circuit areas 3 outside the internal circuit area 2, an I/O circuit such as an input buffer circuit or an output buffer circuit is formed. Electrode pads 4 are put on the respective I/O circuit areas 3. The electrode pad 4 partially protrudes from the I/O circuit area 3. Each electrode pad 4 and the I/O circuit in the I/O circuit area 3 are electrically connected together. The electrode pad 4 on the I/O circuit area 3 is connected with an external electrode by means of wire bonding. An input signal from the external electrode is input to the internal circuit through the I/O circuit in the I/O circuit area 3. Furthermore, an output signal from the internal circuit is output to the external electrode through the I/O circuit in the I/O circuit area 3.

Figure 3:
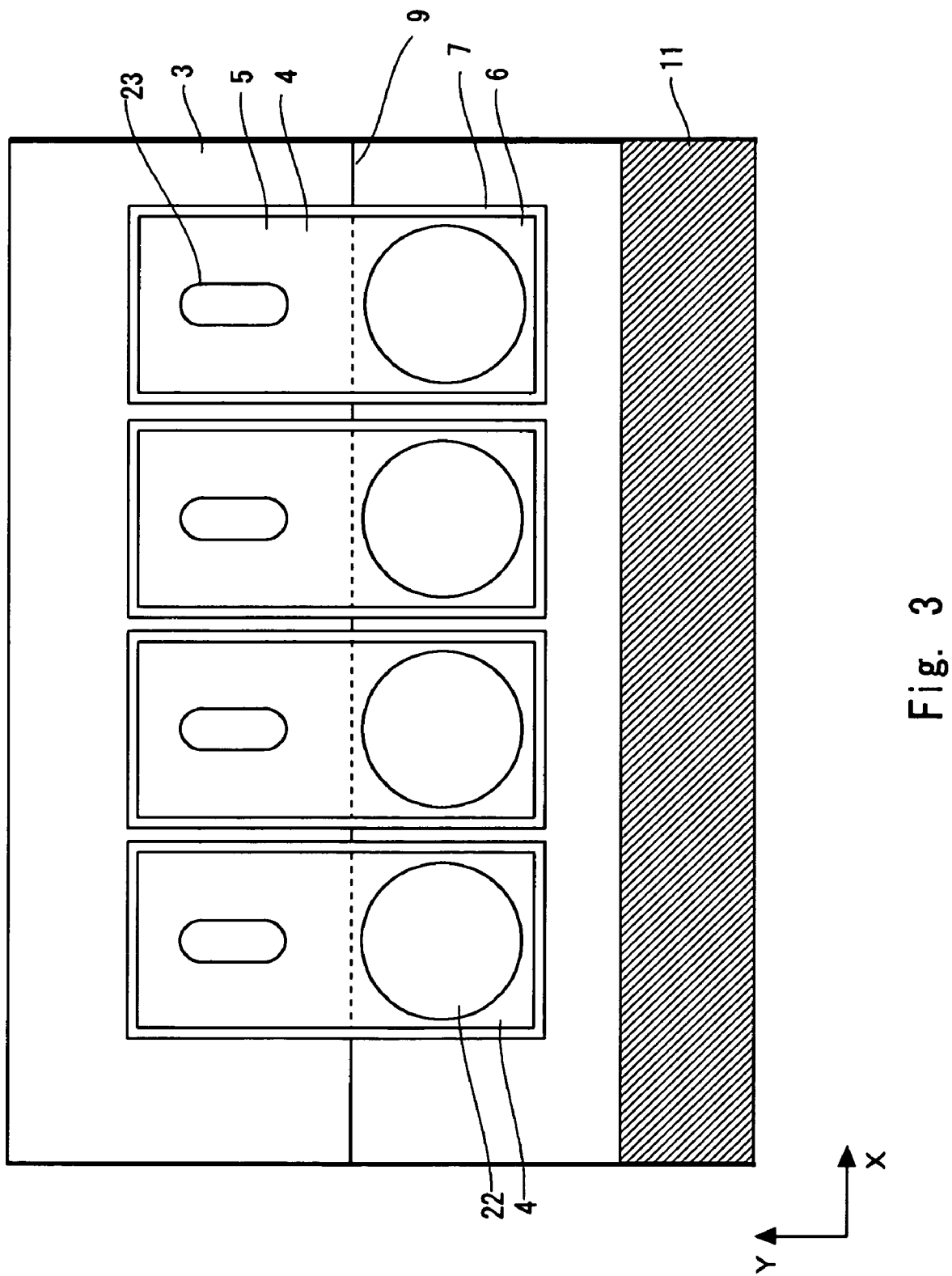
FIG. 3 is an enlarged top view of the structure of a peripheral portion of an electrode pad on the semiconductor chip according to the embodiment of the invention.
Figure 4:
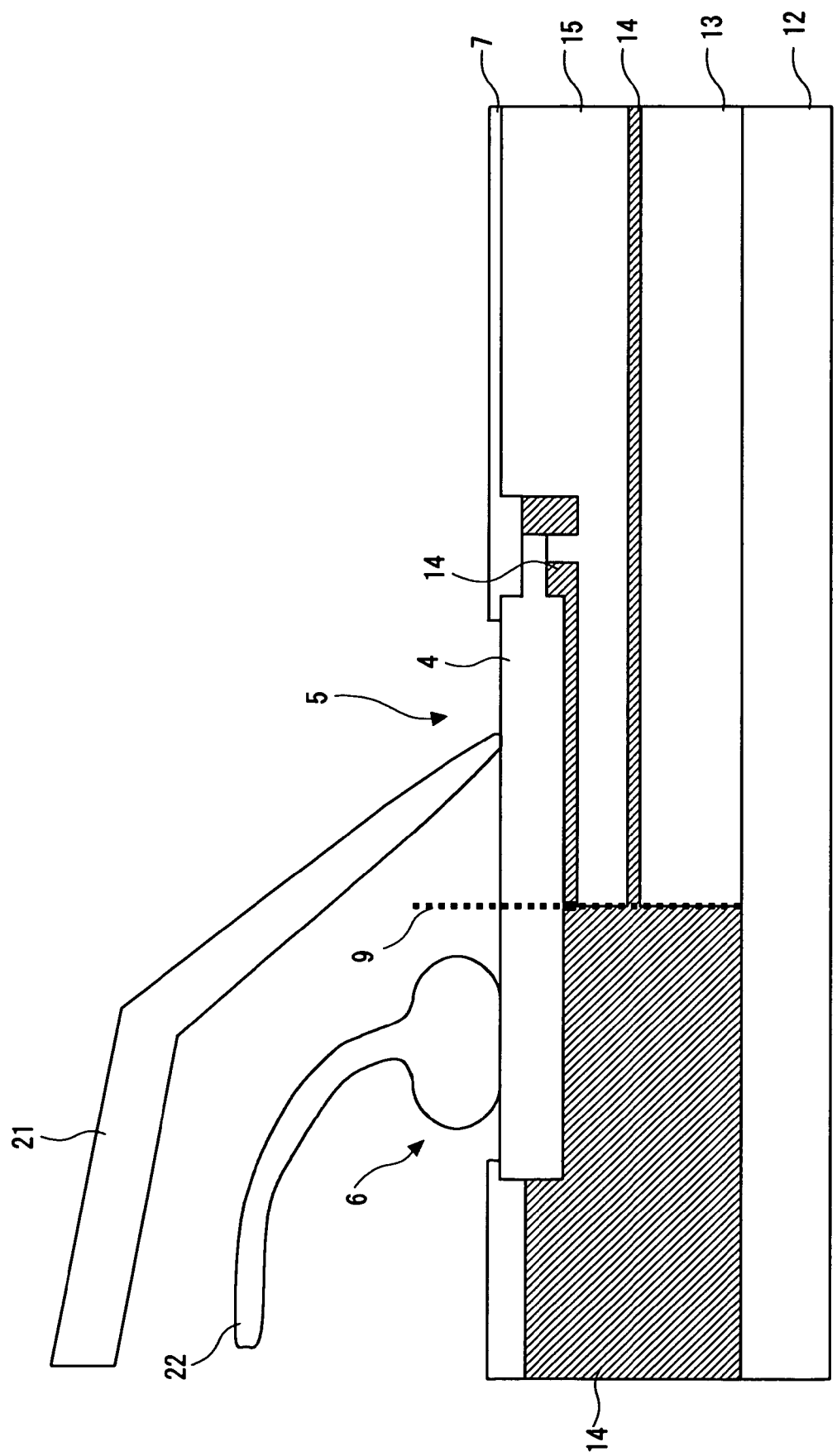
FIG. 4 is an enlarged side sectional view of the structure of the peripheral portion of an electrode pad on the semiconductor chip according to the embodiment of the invention.

Referring to FIGS. 3 and 4, the structure of the electrode pad 4 on the I/O circuit area 3 is described. FIG. 3 is an enlarged top view of the structure of a peripheral portion of the electrode pad 4. FIG. 3 illustrates the electrode pad 4 in the I/O circuit area 3 on the lower side of the semiconductor chip 1 of FIG. 2. FIG. 4 is an enlarged side sectional view of the structure of the peripheral portion of the electrode pad.

As shown in FIG. 3, the electrode pad 4 is placed on the I/O circuit area 3. As shown in FIG. 4, in the I/O circuit area 3, a transistor structural part 13 of the I/O circuit is formed. In the transistor structural part 13, a transistor serving as an I/O circuit and its electrodes are formed. Furthermore, a line structural part 15 is formed on the transistor structural part 13 through an interlayer insulating film 14. In the line structural part 15, a line extending up to the transistor structural part 13 is formed, for example. In addition, the line of the line structural part 15 is connected with the electrode pad 4. The interlayer insulating film 14 is sandwiched between the transistor structural part 13 and the line structural part 15. The line of the line structural part 15 is connected with the transistor of the transistor structural part 13 or the like through a via-hole formed in the interlayer insulating film 14. Moreover, an uppermost insulating film 7 is formed on the line structural part 15. On a substrate 12 as a wafer, an area including the transistor structural part 13 and the line structural part 15 corresponds to the I/O circuit area 3. Meanwhile, the interlayer insulating film 14 is formed outside the I/O circuit area 3. That is, neither electrode nor line is formed below the electrode pad 4 outside the I/O circuit area 3. In this area, only the insulating film is formed. Incidentally, the uppermost insulating film 7 is partially removed to expose the electrode pad 4. That is, the uppermost insulating film 7 is patterned to expose a conductive portion of the electrode pad 4. Further, the uppermost insulating film 7 overlaps end portions of the electrode pad 4. Accordingly, only the end portions of the electrode pad 4 are covered with the uppermost insulating film 7. Thus, a central portion of the electrode pad 4 is exposed. Here, FIG. 4 schematically shows the structure of the peripheral portion of the electrode pad of the semiconductor device of this embodiment, but the present invention is not limited to this structure.

The electrode pad 4 partially protrudes from the I/O circuit area 3. That is, only an inner portion of the electrode pad 4 is formed on the I/O circuit area 3, and the outer portion thereof projects from the I/O circuit area 3. In other words, the electrode pad 4 is placed across an outer edge 9 of the I/O circuit area 3. Here, an area on the I/O circuit area 3 and an area outside the I/O circuit area 3 out of the exposed portion of the electrode pad 4 are a probe area 5 and a bonding area 6, respectively. The exposed portion of the electrode pad 4 extends over the I/O circuit area 3. The electrode pad 4 is constituted of the probe area 5 positioned inside the outer edge 9 and the bonding area 6 positioned outside the outer edge 9. That is, the electrode pad 4 is divided into the bonding area 6 and the probe area 5 across the outer edge 9 of the I/O circuit area 3.

As shown in FIG. 4, the test probe 21 contacts the probe area 5 for probe testing. Further, a bonding wire 22 is connected with the bonding area 6 for bonding. As shown in FIG. 3, the uppermost insulating film 7 is formed around the electrode pad 4. The exposed portion of the electrode pad 4 is subjected to probing and bonding.

The electrode pad 4 of FIG. 3 has a rectangular shape with the width of 75 μm in the X direction and the length of 156 μm in the Y direction. The exposed portion of the electrode pad 4 has the width of 67 μm in the X direction and the length of 148 μm in the Y direction. That is, the outer peripheral portion of the electrode pad 4 is covered with the uppermost insulating film 7 with the width of 4 μm. Thus, the exposed portion of the electrode pad 4 takes a rectangular shape that measures 67 μm×148 μm. The uppermost insulating film 7 partially covers the electrode pad 4 like a frame. A pitch between the adjacent electrode pads 4 in the X direction is 80 μm.

Here, the length of the bonding area 6 in the X direction is preferably set equal to the width of the exposed portion of the electrode pad 4 in the Y direction. That is, in the above example, the width of the bonding area 6 is preferably 67 μm. In this case, the surface area of the bonding area 6 is 67 μm×67 μm, and the surface area of the probe area 5 is 67 μm×81 μm. Thus, the bonding area 6 has substantially square shape. A 60 μm-diameter circular portion of the square bonding area 6 is connected with the bonding wire 22. That is, the bonding wire 22 contacts the bonding area in the 60 μm-diameter circular portion. Hence, in the bonding area 6, an area other than the contact portion with the bonding wire 22 can be reduced. That is, even if the bonding area 6 is small, the bonding wire 22 can be reliably bonded within the bonding area 6. Incidentally, the aforementioned size of the electrode pad 4 is just a typical value, and the present invention is not limited to this value. The sizes of the bonding area 6 and the probe area 5 may be determined in accordance with accuracy of the bonding apparatus and the probe testing apparatus.

The scribe line 11 extends along the X direction, outside the I/O circuit area 3. The scribe line 11 is formed along the outer edge 9 of the I/O circuit area 3. The plural electrode pads 4 are arranged along the scribe line 11. Then, the semiconductor wafer 100 is cut along the scribe line. The semiconductor wafer 100 is scribed into the plural semiconductor chips 1. To scribe the wafer on the scribe line 11, the electrode pad 4 is placed inside the scribe line 11. That is, the bonding area 6 of the electrode pad 4 is defined between the scribe line 11 and the I/O circuit area 3. The width of the scribe line 11 at the scribe center and edge portions is, for example, 50 μm. A distance from the scribe edge of the scribe line 11 to the electrode pad 4 is, for example, 25.65 μm.

As described above, an area inside the outer edge 9 of the I/O circuit area 3 and an area outside the outer edge 9 of the I/O circuit area 3 of the electrode pad 4 are set to the probe area 5 and the bonding area 6, respectively. Furthermore, the probe area 5 and the bonding area 6 are different areas. Then, in a step of inspecting the semiconductor chip 1, a test probe 21 comes into contact with the probe area 5 of the electrode pad 4 for probe testing. As shown in FIG. 3, in the inspecting step, the test probe forms a probe mark 23 in the probe area 5 of the electrode pad 4.

The bonding wire 22 for establishing connection with the external electrode is connected with the bonding area 6 of the electrode pad 4. The semiconductor chip 1 obtained by scribing the wafer along the scribe line 11 is wire-bonded in a wire-bonding step. The bonding area 6 is positioned outside the I/O circuit area 3. Thus, only the uppermost insulating film 7, the interlayer insulating film 14, or other such insulating film is formed below the bonding area 6, and lines, electrodes, or transistors of the I/O circuit are not formed. Accordingly, it is possible to prevent the circuit from being damaged due to a load of the wire bonding. Thus, wire-bonding can be executed without individually setting the optimum use conditions for different bonding apparatuses. Thus, even if a product is shipped in a chip form, it is unnecessary to set the optimal conditions for each bonding apparatus, and any desired bonding apparatus can be used. Thus, even in the case of shipping the product in a chip form, the wire-bonding can be easily and simply performed.

Further, according to the present invention, the probe area 5 and the bonding area 6 are different areas. Therefore, it is possible to prevent the formation of the probe mark in the bonding area 6 and to reliably execute bonding. That is, the test probe 21 comes into contact with the probe area 5 different from the bonding area 6. Hence, no probe mark remains in the bonding area 6, and the surface is kept flat. Accordingly, the bonding wire is not connected with the probe mark. Hence, the wire-bonding can be reliably executed.

The above semiconductor chip manufacturing process is described. First, patterns are formed on the semiconductor wafer 100, the I/O circuit is implemented in the I/O circuit area 3, and the internal circuit is implemented in the internal circuit area 2 using a general film formation or lithographic process. In this case, the electrode pad 4 is formed on the I/O circuit area 3. Further, the electrode pad 4 partially protrudes from the outer edge of the I/O circuit area 3. The electrode pad 4 is generally formed using a metal conductive film such as an aluminum film.

After the formation of the electrode pad 4 together with the internal circuit and the I/O circuit, electrical inspection is carried out. First, the test probe for inspection is moved to the probe area 5 of the electrode pad 4, and the tip end of the test probe is brought into contact with the electrode pad 4. Then, an inspection signal is input from the test probe for inspection through the electrode pad 4, and the output signal is monitored. As a result, the quality of a semiconductor chip on the semiconductor wafer is checked. More specifically, the tip end of the test probe 21 is put into contact with the electrode pad 4 of the semiconductor chip 1, and an electrical signal is output from a tester (not shown). An output signal from the semiconductor chip based on the electrical signal is detected to measure and test electrical characteristics of the semiconductor chip 1. The quality of the semiconductor chip is checked based on the result of probe testing. This inspection is executed for all semiconductor chips to inspect in the wafer.

As a result of the quality check, passed semiconductor chips and rejected ones are given different marks and screened out. Then, the semiconductor wafer 100 is cut along the scribe line, after which the rejected semiconductor chips are discarded. The passed semiconductor chips 1 are passed to an assembling step and subjected to die-bonding or wire-bonding. At this time, the wire is bonded to the bonding area 6 of the electrode pad 4 through the wire bonding. The bonding area 6 is separate from the probe area 5, so the bonding can be reliably carried out. That is, since no probe mark remains in the bonding area 6 upon the probe testing, the wire can be bonded to a flat portion in the electrode pad 4. As a result, a bonding reliability can be improved.

At this time, the outer edge 9 of the I/O circuit area 3 can be used as a mark for defining the probe area 5 or the bonding area. That is, bonding or probing is executed while the electrode pad 4 is optically observed. Lines or electrodes are formed inside the outer edge 9 of the I/O circuit area 3, and only an insulating film is formed outside the outer edge. Accordingly, the bonding area 6 of the electrode pad is positioned outside the outer edge of the metal film. Hence, it is possible to easily determine whether a target area is positioned outside or inside the outer edge 9 of the I/O circuit area 3, and to easily distinguish between the probe area 5 and the bonding area 6. Thus, it is possible to readily distinguish whether the bonding wire or the tip end of the test probe contacts the probe area 5 or the bonding area 6. Accordingly, the probing and the bonding can be accurately executed.

Owing to the above structure, the wire can be bonded outside the I/O circuit area 3, so it is possible to suppress a physical damage due to the bonding. Furthermore, a part of the electrode pad 4 is placed in a spare space between the outer edge 9 of the I/O circuit area 3 and the scribe line 11. As a result, enlargement of a chip can be prevented. Further, even if bonding is executed using different bonding apparatuses, it is unnecessary to individually set the conditions for each bonding apparatus. Therefore, various bonding apparatuses can be used for bonding in a simple manner. Hence, the semiconductor device of the present invention is suitable for shipment in the chip form. Further, in the case of evaluating a chip after the bonding, bonding wire for evaluation can be connected to the probe area 5. Consequently, the chip can be mounted to an evaluating package and evaluated readily and simply.

It is apparent that the present invention is not limited to the above embodiment that may be modified and changed without departing from the scope and spirit of the invention.

What is claimed is:

1. A semiconductor device comprising:
   a semiconductor substrate;
   at least one internal circuit and I/O circuit areas; and
   an electrode pad formed above said semiconductor substrate and having a first portion and a second portion, said second portion for wire bonding,
   wherein said I/O circuit areas are formed only under said first portion of said electrode pad and not formed under said second portion of said electrode pad there being only insulation between said second portion of said electrode pad and said substrate, there being no portions of said internal circuit or any of said I/O circuits under said second portion.

2. The semiconductor device according to claim 1, further comprising:
   a transistor structural part formed on said semiconductor substrate for forming at least a transistor, and said transistor structural part formed under said first portion and not under said second portion.

3. The semiconductor device according to claim 1, further comprising:
   an insulating film formed between said electrode pad and said line structural part, said insulating film formed under said first and second portions.

4. A semiconductor device according to claim 1, wherein said second portion of said electrode pad is connected to a bonding wire.

5. The semiconductor device according to claim 2, further comprising:
an insulating film formed between said line structural part and said transistor structural part.

6. A semiconductor device comprising:
a semiconductor substrate;
at least one internal circuit and I/O circuit areas;
a transistor structural part formed on said semiconductor substrate for forming at least a transistor; and
an electrode pad formed above said transistor structural part, and having a first portion and a second portion, said second portion for a wire bonding, said transistor structural part formed under only said first portion and not under said second portion,
wherein there is only insulation between said second portion of said electrode pad and said substrate.

7. The semiconductor device according to claim 6, further comprising:
a line structural part formed under said electrode pad and having at least a line, said line structural part formed under said first portion and not under said second portion.

8. The semiconductor device according to claim 7, further comprising:
an insulating film formed between said line structural part and said transistor structural part.

9. The semiconductor device according to claim 7, further comprising:
an insulating film formed between said electrode pad and said line structural part, said insulating film formed under said first and second portions.

* * * * *